(12) United States Patent
Sun et al.

(10) Patent No.: US 11,348,968 B2
(45) Date of Patent: May 31, 2022

(54) DISPLAY DEVICE STRUCTURE

(71) Applicant: Hongyu Liu, Shandong (CN)

(72) Inventors: Runguang Sun, Shanghai (CN);
Hongyu Liu, Shandong (CN)

(73) Assignee: Hongyu Liu, Shandong (CN)

( * ) Notice: Subject to any disclaimer, the term of this patent is extended or adjusted under 35 U.S.C. 154(b) by 0 days.

(21) Appl. No.: 16/772,801

(22) PCT Filed: Jan. 2, 2018

(86) PCT No.: PCT/CN2018/000005
§ 371 (c)(1),
(2) Date: Jun. 14, 2020

(87) PCT Pub. No.: WO2019/134057
PCT Pub. Date: Jul. 11, 2019

(65) Prior Publication Data
US 2021/0167120 A1    Jun. 3, 2021

(51) Int. Cl.
*H01L 27/15*    (2006.01)
*H01L 33/48*    (2010.01)
*H01L 33/62*    (2010.01)

(52) U.S. Cl.
CPC .......... *H01L 27/156* (2013.01); *H01L 33/486* (2013.01); *H01L 33/62* (2013.01)

(58) Field of Classification Search
CPC ..... H01L 27/156; H01L 33/486; H01L 33/62; H01L 27/32
See application file for complete search history.

(56) References Cited

U.S. PATENT DOCUMENTS

| | | | | |
|---|---|---|---|---|
| 2014/0267683 A1* | 9/2014 | Bibi | ...................... | H01L 27/156 348/87 |
| 2015/0371585 A1* | 12/2015 | Bower | .................. | H01L 33/385 345/1.1 |
| 2017/0133357 A1* | 5/2017 | Kuo | ..................... | H01L 25/0753 |
| 2017/0254518 A1* | 9/2017 | Vasylyev | ............. | G02B 6/0068 |
| 2018/0122786 A1* | 5/2018 | Wu | ...................... | H01L 25/0753 |
| 2018/0166429 A1* | 6/2018 | Chong | ..................... | H01L 27/15 |
| 2018/0190631 A1* | 7/2018 | Kim | ..................... | G02F 1/13452 |
| 2018/0191978 A1* | 7/2018 | Cok | ..................... | G09G 3/3208 |
| 2018/0210266 A1* | 7/2018 | Lius | ..................... | G02F 1/1347 |
| 2018/0294254 A1* | 10/2018 | Chen | ................. | G02B 19/0019 |
| 2019/0044023 A1* | 2/2019 | Cheng | .................... | H01L 33/62 |
| 2020/0235077 A1* | 7/2020 | Jeon | ..................... | H01L 27/3225 |

* cited by examiner

*Primary Examiner* — Victor A Mandala
(74) *Attorney, Agent, or Firm* — Liang Legal Group, PLLC

(57) ABSTRACT

An arbitrary curved-surface display device which has unit display pixels including active inorganic micro-light emitting diode unit chips, wherein each active inorganic micro-light emitting diode unit chip comprises an inorganic light-emitting diode unit device and a field-effect transistor. Conducting wires are on a substrate of the arbitrary-curved surface, and the conducting wires connect to each active inorganic micro-light emitting diode unit chip.

20 Claims, 3 Drawing Sheets

DISPLAY DEVICE STRUCTURE

TECHNICAL FIELD

The present invention relates to a display device structure, particularly to an arbitrarily curved (flexible) display device, in which a unit display pixel is composed of micro inorganic light-emitting diode unit chips.

BACKGROUND

The current mainstream flat panel display technologies include liquid crystal display (LCD) and organic light-emitting diode (OLED). In both technologies, thin film transistors are fabricated on a glass substrate to form an active matrix circuit, and then liquid crystals are filled in to form liquid crystal cells, or an organic light emitting layer is deposited to form an organic light emitting device. Recently, a new type of micro-inorganic light-emitting diode display technology (Micro-LED) has appeared, which uses a mass transfer technology to transfer the inorganic light-emitting diode unit chip (µILED) onto a substrate to form a passive matrix display through conductive wires. However, passive matrix display peripheral circuits are complex, and it is difficult to achieve high-resolution display.

SUMMARY OF THE INVENTION

The present invention provides a device structure of an active-matrix inorganic light-emitting diode display device that can realize an arbitrarily curved surface.

According to one aspect of the present invention, a display pixel comprises a micro active inorganic light-emitting diode unit chip. Each micro active inorganic light-emitting diode unit chip includes a micro inorganic light-emitting diode and one or more field-effect transistors.

According to one aspect of the present invention, an active layer of the field-effect transistor included in the micro active inorganic light-emitting diode unit chip (µAMLED) uses the same material of one layer of the micro inorganic light-emitting diode.

According to one aspect of the present invention, two layers of the field-effect transistor included in the micro active inorganic light-emitting diode unit chip uses the same materials as those of the micro inorganic light-emitting diode.

According to an aspect of the present invention, the substrate comprises a wire, and the wire is connected to each micro active inorganic light-emitting diode unit chip.

According to an aspect of the present invention, the wires present on the substrate may comprise a metal material, or a transparent metal compound material, or a semiconductor compound, such as indium tin oxide, gallium nitride, etc.

According to an aspect of the present invention, the wires present on the substrate may be formed by a photolithography method or a printing method.

According to one aspect of the invention, the substrate may include a sensor device, which may be an optical sensor device or a pressure sensor device. The sensor device is connected to the wire, or may be connected to the field-effect transistor of the micro active inorganic light-emitting diode unit chip via the wire, or may be connected to the wire via the field-effect transistor included in the sensor device itself.

According to an aspect of the present invention, the substrate may be a rigid material, such as glass or a printed circuit board, or the substrate may also be a flexible material, such as polyimide.

The invention may provide the following beneficial effects:

At present, low-temperature polysilicon technology used in organic electroluminescent flat panel display devices is difficult to achieve large-area uniformity, and oxide transistors have stability problems. The present invention simultaneously manufactures the field-effect transistor of the pixel driving circuit (hereinafter, "driving field-effect transistor") and the inorganic light-emitting diode unit device, overcomes the above problems, and reduces the equipment cost of the display screen factory.

BRIEF DESCRIPTION OF DRAWINGS

FIG. 1 shows a schematic diagram for a structure of a micro active inorganic light-emitting diode array.

FIG. 2 shows a schematic diagram for a structure of a micro active inorganic light-emitting diode array with the substrate removed.

FIG. 3 shows a schematic diagram for a unit display pixel with a micro active inorganic light-emitting diode unit chip transferred onto a flexible display device substrate.

FIG. 4 shows a sectional view along the A-A' section in FIG. 3.

FIG. 5 shows a schematic diagram of a unit display pixel, in which another conductive wire is made to complete wires in each direction for connections with the micro active inorganic light-emitting diode unit.

FIG. 6 shows a sectional view along the B-B' section in FIG. 5.

DETAILED DESCRIPTION

The following description, together with the drawings, illustrate embodiments of the invention.

Example 1

Figure 1:
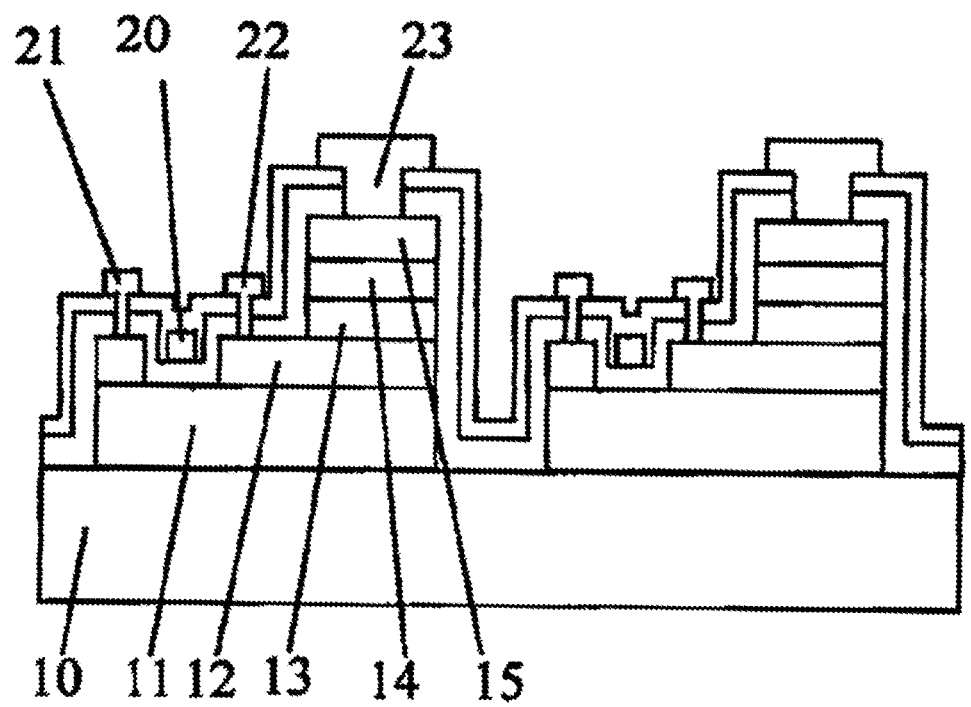
FIGS. 1-6 show a manufacturing process for an arbitrarily curved (i.e., arbitrarily curved-surface) display device, wherein unit display pixels comprise micro active inorganic light-emitting diode unit chips.

FIG. 1 shows a schematic diagram for a structure of a micro active inorganic light-emitting diode array fabricated on a substrate, including: a micro inorganic light-emitting diode substrate 10, an undoped layer 11 of the micro inorganic light-emitting diode, an electron-type transport layer 12 of the micro inorganic light-emitting diode, an inorganic light-emitting layer 13 of the micro inorganic light-emitting diode, a hole-type transport layer 14 of the micro inorganic light-emitting diode, a hole-type conductive electrode 15 of the micro inorganic light-emitting diode, a gate electrode 20 of a driving field-effect transistor, a source electrode 21 of the driving field-effect transistor, a drain electrode 22 of the driving field-effect transistor, a lead electrode 23 of the hole-type conductive electrode of the micro inorganic light-emitting diode.

Wherein the undoped layer 11 of the inorganic light-emitting diode also serves as a drive layer for the driving field-effect transistor, and the electron-type inorganic transmission layer 12 of the inorganic light-emitting diode also serves as an ohmic contact layer for the driving field-effect transistor.

Figure 2:
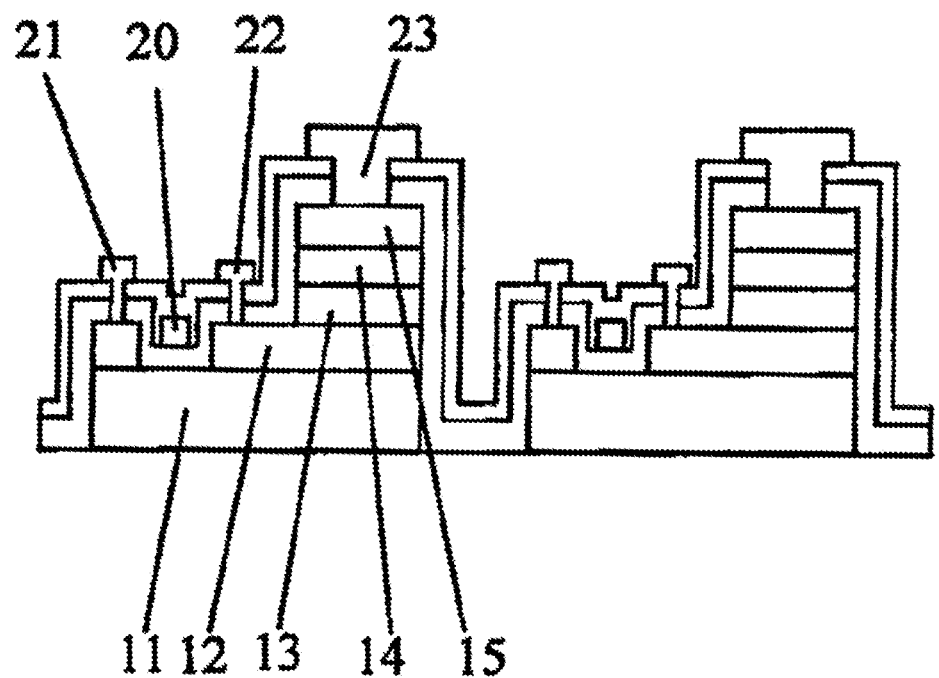

FIG. 2 shows a schematic diagram of the structure of a micro-inorganic light-emitting diode array with the substrate removed.

Wherein, for a silicon-based substrate, a chemical etching method may be used to remove the substrate, and for a sapphire substrate, a laser lift-off method may be used to remove the substrate.

Figure 3:
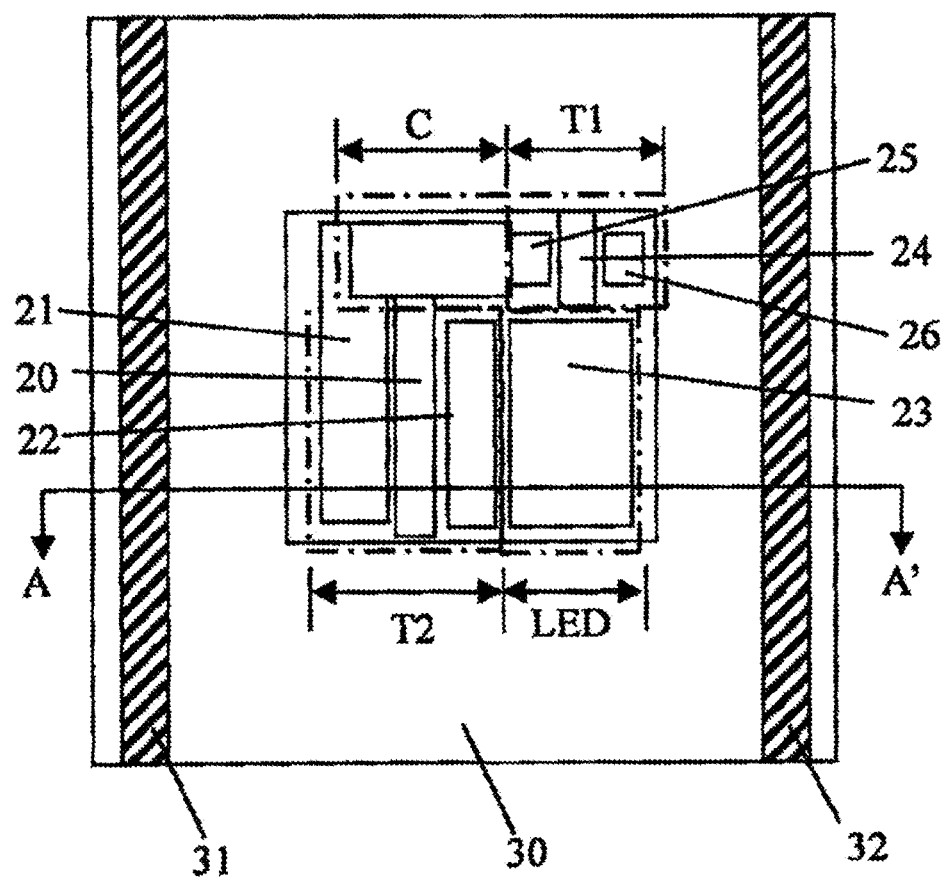

FIG. 3 shows a schematic diagram of a unit display pixel of a micro inorganic light-emitting diode unit chip transferred onto an arbitrarily curved display device substrate, which includes: an arbitrarily curved display device substrate 30, a ground line 31, a data line 32 of a switching field-effect transistor, a gate electrode 24 of the switching field-effect transistor, a drain electrode 26 of the switching field-effect transistor, and a source electrode 25 of the switching field-effect transistor. The T1 area represents the switching field-effect transistor area, the C area represents the storage capacitor area, and the T2 area represents the driving field-effect transistor area. LED area represents the area of micro inorganic light-emitting diode.

Figure 4:
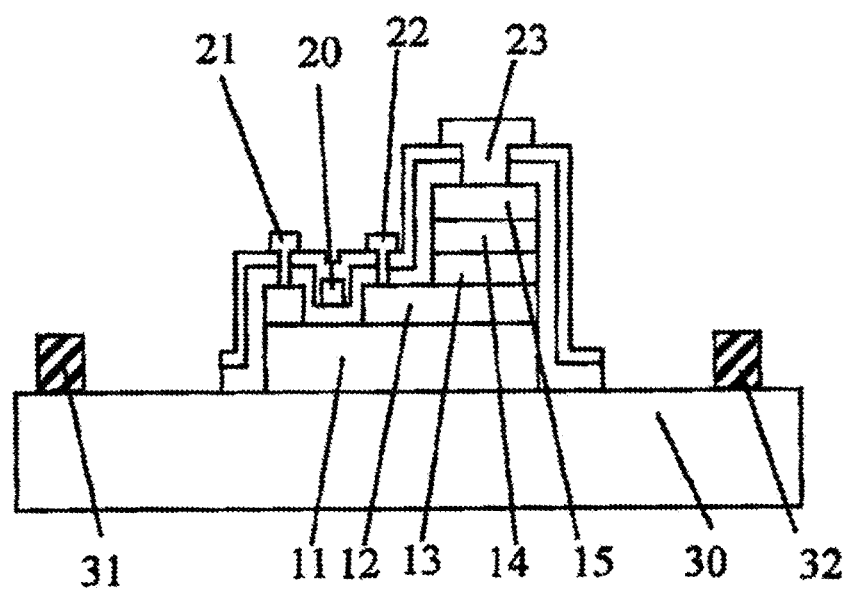

FIG. 4 shows a sectional view along the A-A' section in FIG. 3.

Figure 5:
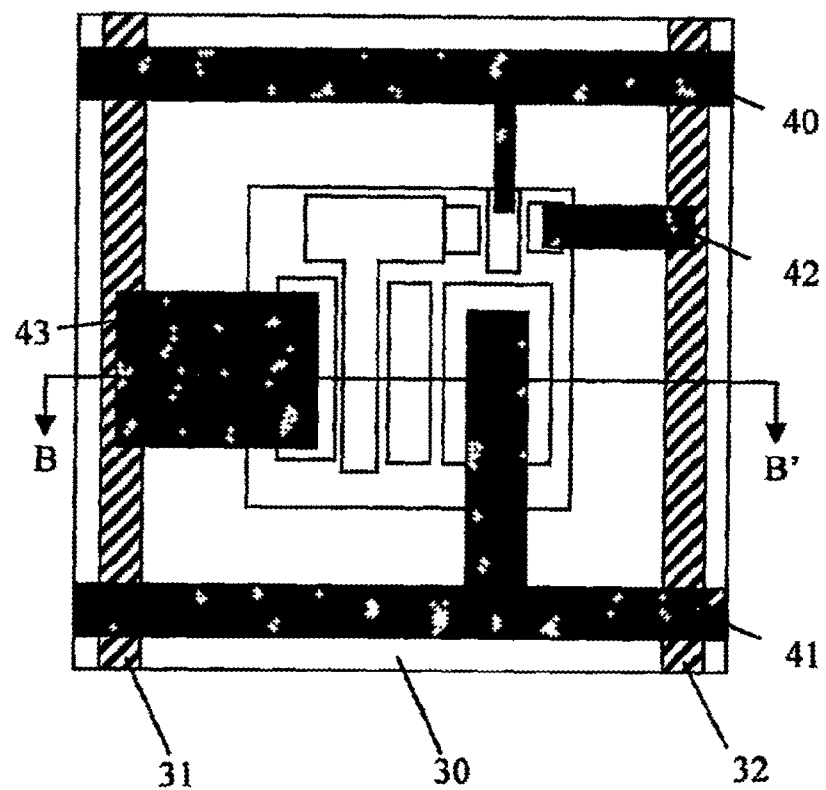

FIG. 5 shows a schematic diagram of a unit display pixel, in which wires in another direction are made to complete all direction connections in the micro inorganic light-emitting diode unit chip. The process steps include: making an insulating film, forming vias, and making wires, wherein the scanning line 40 is connected to the gate of the switching field-effect transistor, the Vdd line 41 is connected to the lead electrode 23 of the hole-type conductive electrode of the inorganic light-emitting diode, and the wire 42 is connected to the data line 32 and the drain electrode 26 of the switching field-effect transistor. The wire 43 connects the ground line 31 and the source electrode 21 of the driving field-effect transistor.

Figure 6:
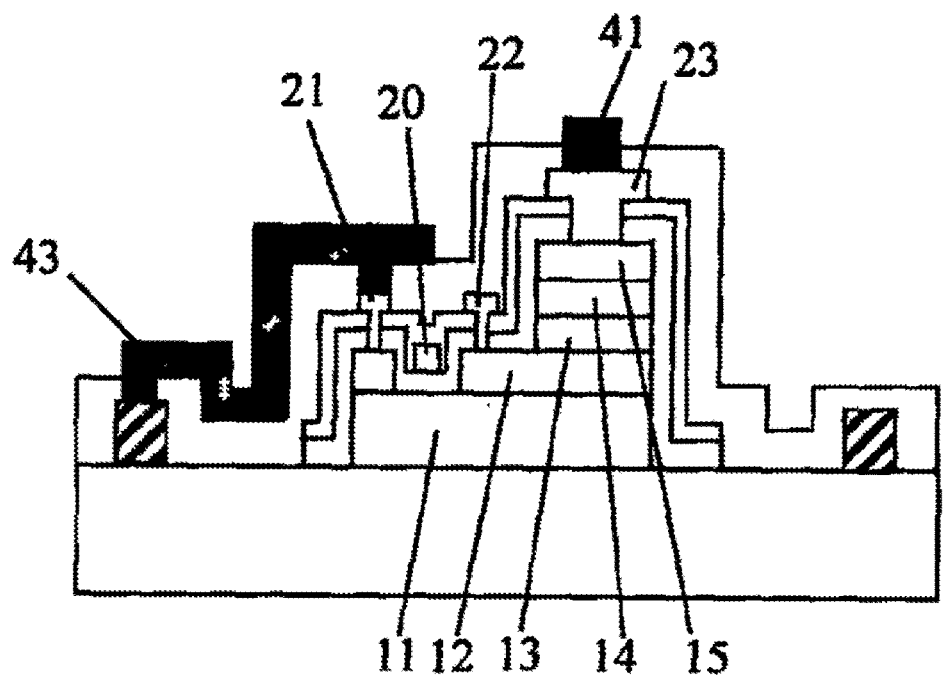

FIG. 6 shows a sectional view along the B-B' section in FIG. 5.

Example 2

In the process of transferring the micro inorganic light-emitting diode unit chip to a arbitrarily curved display device substrate, the micro light-emitting diode is also transferred to the arbitrarily curved display device substrate. The signal of the micro light-emitting diode is transmitted to the peripheral circuit via a wire or transmitted via the wire to the field-effect transistor included in the micro inorganic light-emitting diode unit chip, and then transmitted to the micro inorganic light-emitting diode included in the micro inorganic light-emitting diode unit chip or the peripheral circuit.

The preferred embodiments of the present invention have been described above. Those skilled in the art would appreciate that various changes and modifications can be made without departing from the spirit of the present invention and the scope of the claims.

What is claimed is:

1. An arbitrarily curved display device, comprising: a substrate and display pixels disposed on the substrate, wherein the display pixels comprise micro active inorganic light-emitting diode unit chips, and wherein each of the micro active inorganic light-emitting diode unit chips comprises a micro inorganic light-emitting diode and one or more field-effect transistors.

2. The arbitrarily curved display device according to claim 1, wherein the each of the micro active inorganic light-emitting diode unit chips further comprises one or more capacitors.

3. The arbitrarily curved display device according to claim 1, wherein a material used in one or more layers of the field-effect transistor is the same as a material used in one or more layers of the micro inorganic light-emitting diode.

4. The arbitrarily curved display device according to claim 1, wherein the substrate comprises a conductive wire thereon and the conductive wire connects with each of the micro active inorganic light-emitting diode unit chips.

5. The arbitrarily curved display device according to claim 1, wherein the substrate comprises a conductive wire and a sensor thereon and the sensor connects with the conductive wire.

6. The arbitrarily curved display device according to claim 5, wherein the sensor is connected via the conductive wire to the field-effect transistors in the micro active inorganic light-emitting diode unit chips.

7. The arbitrarily curved display device according to claim 1, wherein the substrate is a rigid substrate.

8. The arbitrarily curved display device according to claim 1, wherein the substrate is a flexible substrate.

9. The arbitrarily curved display device according to claim 2, wherein a material used in one or more layers of the field-effect transistor is the same as a material used in one or more layers of the micro inorganic light-emitting diode.

10. The arbitrarily curved display device according to claim 2, wherein the substrate includes a conductive wire thereon and the conductive wire connects with each of the micro active inorganic light-emitting diode unit chips.

11. The arbitrarily curved display device according to claim 3, wherein the substrate includes a conductive wire thereon and the conductive wire connects with each of the micro active inorganic light-emitting diode unit chips.

12. The arbitrarily curved display device according to claim 2, wherein the substrate comprises a conductive wire and a sensor thereon and the sensor connects with the conductive wire.

13. The arbitrarily curved display device according to claim 3, wherein the substrate comprises a conductive wire and a sensor thereon and the sensor connects with the conductive wire.

14. The arbitrarily curved display device according to claim 4, wherein the substrate comprises a sensor thereon and the sensor connects with the conductive wire.

15. The arbitrarily curved display device according to claim 12, wherein the sensor is connected via the conductive wire to the field-effect transistors in the micro active inorganic light-emitting diode unit chips.

16. The arbitrarily curved display device according to claim 13, wherein the sensor is connected via the conductive wire to the field-effect transistors in the micro active inorganic light-emitting diode unit chips.

17. The arbitrarily curved display device according to claim 14, wherein the sensor is connected via the conductive wire to the field-effect transistors in the micro active inorganic light-emitting diode unit chips.

18. The arbitrarily curved display device according to claim 2, wherein the substrate is a flexible substrate.

19. The arbitrarily curved display device according to claim 3, wherein the substrate is a flexible substrate.

20. The arbitrarily curved display device according to claim 4, wherein the substrate is a flexible substrate.

* * * * *